(12) United States Patent
Okuda et al.

(10) Patent No.: US 8,366,868 B2
(45) Date of Patent: Feb. 5, 2013

(54) SUBSTRATE PROCESSING APPARATUS

(75) Inventors: Kazuyuki Okuda, Tokyo (JP); Toru Kagaya, Tokyo (JP); Masanori Sakai, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/489,018

(22) Filed: Jun. 5, 2012

(65) Prior Publication Data

US 2012/0240348 A1 Sep. 27, 2012

Related U.S. Application Data

(60) Division of application No. 12/954,369, filed on Nov. 24, 2010, now Pat. No. 8,211,802, which is a continuation of application No. 12/404,932, filed on Mar. 16, 2009, now abandoned, which is a division of application No. 11/271,900, filed on Nov. 14, 2005, now abandoned, which is a continuation of application No. 10/400,577, filed on Mar. 28, 2003, now abandoned.

(30) Foreign Application Priority Data

Mar. 28, 2002 (JP) .................................. 2002-092733
Dec. 18, 2002 (JP) .................................. 2002-366250

(51) Int. Cl.
*C23F 1/00* (2006.01)
*H01L 21/306* (2006.01)
*C23C 16/52* (2006.01)
*C23C 16/06* (2006.01)
*C23C 16/22* (2006.01)

(52) U.S. Cl. .................... 156/345.24; 118/695; 118/696; 438/689; 134/1.1; 156/345.26; 257/E21.219

(58) Field of Classification Search .................. 118/695, 118/696; 156/345.24, 345.26; 438/689; 134/1.1, 22.1; 257/E21.219
See application file for complete search history.

(56) References Cited

U.S. PATENT DOCUMENTS

| 5,091,207 | A | * | 2/1992 | Tanaka ............................... 427/8 |
| 5,246,500 | A | * | 9/1993 | Samata et al. ................. 118/719 |
| 5,314,541 | A | * | 5/1994 | Saito et al. ..................... 118/725 |
| 5,368,685 | A | * | 11/1994 | Kumihashi et al. ............. 216/70 |
| 5,380,370 | A | | 1/1995 | Niino et al. |
| 5,565,038 | A | * | 10/1996 | Ashley ............................... 134/2 |

(Continued)

FOREIGN PATENT DOCUMENTS

JP   61017151 A   *   1/1986
JP   63-70428 A        3/1988

(Continued)

OTHER PUBLICATIONS

Office Action dated Mar. 17, 2011 for U.S. Appl. No. 12/404,932.

*Primary Examiner* — Rudy Zervigon
(74) *Attorney, Agent, or Firm* — Birch, Stewart, Kolasch & Birch, LLP

(57) ABSTRACT

A substrate processing apparatus cleaning method that includes: containing a cleaning gas in a reaction tube without generating a gas flow of the cleaning gas in the reaction tube by supplying the cleaning gas into the reaction tube and by completely stopping exhaustion of the cleaning gas from the reaction tube or by exhausting the cleaning gas at an exhausting rate which substantially does not affect uniform diffusion of the cleaning gas in the reaction tube from at a point of time of a period from a predetermined point of time before the cleaning gas is supplied into the reaction tube to a point of time when several seconds are elapsed after starting of supply of the cleaning gas into the reaction tube; and thereafter exhausting the cleaning gas from the reaction tube.

2 Claims, 7 Drawing Sheets

U.S. PATENT DOCUMENTS

| | | | |
|---|---|---|---|
| 5,777,300 A * | 7/1998 | Homma et al. | 219/679 |
| 5,785,796 A | 7/1998 | Lee | |
| 5,873,942 A * | 2/1999 | Park et al. | 118/719 |
| 6,273,954 B2 * | 8/2001 | Nishikawa et al. | 118/692 |
| 6,383,300 B1 * | 5/2002 | Saito et al. | 118/715 |
| 6,807,971 B2 * | 10/2004 | Saito et al. | 134/22.11 |
| 6,881,295 B2 * | 4/2005 | Nagakura | 156/345.33 |
| 7,056,806 B2 * | 6/2006 | Basceri et al. | 438/448 |
| 7,156,923 B2 * | 1/2007 | Kato et al. | 118/715 |
| 7,258,892 B2 * | 8/2007 | Beaman et al. | 427/8 |
| 7,279,398 B2 * | 10/2007 | Basceri et al. | 438/448 |
| 7,344,755 B2 * | 3/2008 | Beaman et al. | 427/255.7 |
| 7,387,685 B2 * | 6/2008 | Carpenter et al. | 118/715 |
| 7,422,635 B2 * | 9/2008 | Zheng et al. | 118/715 |
| 7,481,887 B2 * | 1/2009 | Carpenter et al. | 118/715 |
| 7,674,724 B2 * | 3/2010 | Suzuki et al. | 438/773 |
| 7,771,537 B2 * | 8/2010 | Beaman et al. | 118/725 |
| 8,211,802 B2 * | 7/2012 | Okuda et al. | 438/689 |
| 2001/0054430 A1 | 12/2001 | Katagiri et al. | |
| 2002/0073923 A1 * | 6/2002 | Saito et al. | 118/715 |
| 2003/0036272 A1 * | 2/2003 | Shamouilian et al. | 438/691 |
| 2003/0070617 A1 * | 4/2003 | Kim et al. | 118/715 |
| 2004/0118436 A1 | 6/2004 | Joyce | |
| 2005/0145333 A1 * | 7/2005 | Kannan et al. | 156/345.24 |
| 2005/0223979 A1 * | 10/2005 | Shajii et al. | 118/692 |
| 2005/0282365 A1 * | 12/2005 | Hasebe et al. | 438/513 |
| 2006/0115957 A1 * | 6/2006 | Basceri et al. | 438/448 |
| 2006/0165873 A1 * | 7/2006 | Rueger et al. | 427/8 |
| 2006/0205187 A1 * | 9/2006 | Zheng et al. | 438/478 |
| 2006/0213440 A1 * | 9/2006 | Zheng et al. | 118/715 |
| 2008/0264337 A1 * | 10/2008 | Sano et al. | 118/704 |
| 2009/0130829 A1 * | 5/2009 | Noda et al. | 438/503 |
| 2009/0130860 A1 | 5/2009 | Miya et al. | |
| 2009/0178694 A1 * | 7/2009 | Okuda et al. | 134/22.12 |
| 2010/0192855 A1 * | 8/2010 | Yuasa et al. | 118/696 |

FOREIGN PATENT DOCUMENTS

| | | |
|---|---|---|
| JP | 7-130704 A | 5/1995 |
| JP | 9-275076 A | 10/1997 |
| JP | 2773078 B2 | 4/1998 |
| JP | 10-280151 A | 10/1998 |
| JP | 2000-223430 A | 8/2000 |
| JP | 2001-250818 A | 9/2001 |

* cited by examiner

SUBSTRATE PROCESSING APPARATUS

CROSS-REFERENCE TO RELATED APPLICATIONS

This is a Divisional of application Ser. No. 12/954,369 filed Nov. 24, 2010, now U.S. Pat. No. 8,211,802 which is a Continuation of application Ser. No. 12/404,932 filed on Mar. 16, 2009 now abandoned which is a Divisional of application Ser. No. 11/271,900 filed on Nov. 14, 2005 now abandoned which is a Continuation of application Ser. No. 10/400,577, filed on Mar. 28, 2003, now abandoned and for which priority is claimed under 35 U.S.C. §120. Application Ser. No. 11/271,900 and application Ser. No. 10/400,577 claim priority under 35 U.S.C. §119(a)-(d) on Application No. 2002-092733 filed in Japan on Mar. 28, 2002 and Application No. 2002-366250 filed in Japan on Dec. 18, 2002. The entire contents of each of the above-identified applications are hereby incorporated by reference.

BACKGROUND OF THE INVENTION

1. Field of the Invention

The present invention relates to a substrate processing apparatus, and more particularly, to a cleaning technique in a reaction chamber of a substrate processing apparatus which is a producing apparatus of a semiconductor device used when the semiconductor device is produced on a substrate such as an Si.

2. Description of the Related Art

In a substrate processing apparatus of this kind, it is known that cleaning gas is supplied and exhausted to and from the reaction chamber to clean the chamber (see Japanese Patent Application Laid-open No. 2002-47571).

A conventional producing apparatus of a semiconductor device will be explained with reference to FIG. 7. FIG. 7 is a sectional view showing a conception of a reaction furnace.

In a self-cleaning operation aimed at removing reaction by-product adhering to an inner wall or the like of a reaction tube 1 by desired film-forming processing, a flow rate of etching gas 4 as cleaning gas is controlled to a constant value, and the etching gas 4 is continuously supplied from a gas introducing tube 2 into the reaction tube 1 from a plurality of holes 8 through a gas nozzle 7.

A desired amount of gas is exhausted from the reaction tube 1 by adjusting an opening of a pressure-adjusting valve 5 connected to the gas exhausting tube 3, thereby maintaining a pressure in the reaction tube 1 at a constant value.

In the conventional apparatus and method, however, there is a problem that nonuniform etching and etching remainder are generated.

It is conceived that this is caused because in the conventional technique, the etching gas is supplied while the etching gas is exhausted and thus, the following events occur:

(a) A "flow" is generated toward the gas exhausting tube 3 from the gas introducing tube 2 because of a shape of the reaction tube 1 or a relation between a supplying position and an exhausting position of the gas, most of etching gas is consumed at an upstream portion of the "flow" and the etching gas is less prone to reach a downstream portion of the "flow".

(b) A degree of diffusion of gas is greater in a location in the reaction tube 1 (i.e., in the vicinity of the gas exhausting tube) where a pressure is low, but the degree of diffusion of gas is smaller in a location in the reaction tube (i.e., an upper end of the reaction tube 1 and the like) where the pressure is high. Therefore, etching gas is less prone to reach a high pressure location in the reaction tube 1.

That is, the "flow" toward the gas exhausting tube 3 from the gas introducing tube 2 is generated, and the etching gas is less prone to reach a portion which is not located along the "flow".

More concretely, as shown with arrows in FIG. 7, a strong flow portion 11 along the flow of gas is generated from substantially a center portion to a portion close to the gas exhausting tube 3 in the reaction tube 1, and a weak flow portion 12 which opposes the flow of gas is generated in an upper portion in the reaction tube 1. Therefore, a flow rate of gas and a partial pressure are not constant in the reaction tube 1.

In this specification, the term "flow" means intentional airflow generated from the exhausting operation, and a flow caused by diffusion of gas is excluded.

SUMMARY OF THE INVENTION

It is a main object of the present invention to carry out uniform etching, and by extention to effect uniform cleaning in a reaction tube in a semiconductor device producing apparatus (substrate processing apparatus) for carrying out self-cleaning using etching gas such as $NF_3$.

According to a first aspect of the present invention, there is provided a substrate processing apparatus, comprising:
a reaction tube;
a gas introducing tube which is in communication with said reaction tube;
a gas exhausting tube having a closing member, and
a controller which controls an opening of the closing member to substantially stop exhaustion through the exhausting tube from a predetermined point of time before cleaning gas is supplied from the gas introducing tube into the reaction tube to a point of time when several seconds are elapsed after starting of supply of the cleaning gas into the reaction tube such that there exists a state in which exhaustion from the gas exhausting tube is stopped while the cleaning gas is supplied from the gas introducing tube into the reaction tube to fill the reaction tube with the cleaning gas under control of the controller.

According to a second aspect of the present invention, there is provided a substrate processing apparatus, comprising:
a reaction tube;
a gas introducing tube which is in communication with the reaction tube;
a gas exhausting tube having a closing member, and
a controller which controls an opening of the closing member to substantially stop exhaustion through the exhausting tube from a predetermined point of time before cleaning gas is supplied from the gas introducing tube into the reaction tube to a predetermined point of time after the clean gas is started to be supplied into the reaction tube such that there exists a state in which exhaustion from the gas exhausting tube is stopped while the cleaning gas is supplied from the gas introducing tube into said reaction tube to repeat a first stage which fills the reaction tube with the cleaning gas under control of the controller and a second stage which thereafter exhausts gas from the reaction tube at least once.

According to a third aspect of the present invention, there is provided a substrate processing apparatus, comprising:
a reaction tube;
a gas introducing tube which is in communication with the reaction tube;
a cleaning gas supply member which supplies cleaning gas to the gas introducing tube, and a controller which controls an opening of the closing member to substantially stop exhaustion through the exhausting tube from a predetermined point of time before cleaning gas is supplied from the gas introducing tube into the reaction tube to a point of time when several seconds are elapsed after starting of supply of the cleaning gas into said reaction tube such that there exists a state in which exhaustion from the gas exhausting tube is stopped while the cleaning gas is supplied by said cleaning gas supply member through the gas introducing tube into the reaction tube.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
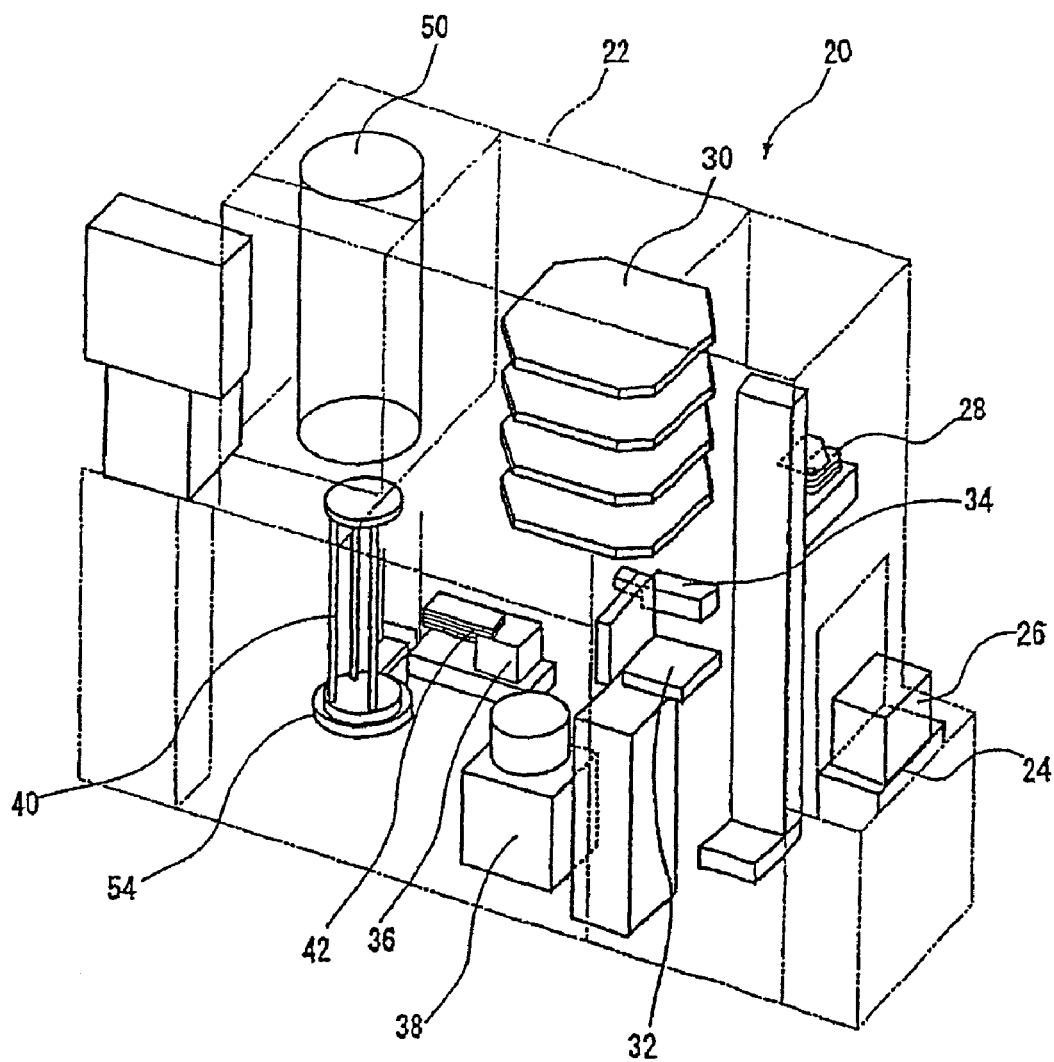
FIG. 1 is a perspective view of a substrate processing apparatus according to an embodiment of the present invention.

A substrate processing apparatus according to a first preferred aspect of the present invention comprises:

a reaction tube;

a gas introducing tube which is in communication with the reaction tube;

a gas exhausting tube having a closing member, and a controller which controls an opening of the closing member to substantially stop exhaustion through the exhausting tube from a predetermined point of time before cleaning gas is supplied from the gas introducing tube into the reaction tube to a point of time when several seconds are elapsed after starting of supply of the cleaning gas into the reaction tube such that there exists a state in which exhaustion from the gas exhausting tube is stopped while the cleaning gas is supplied from said gas introducing tube into the reaction tube to fill the reaction tube with the cleaning gas under control of the controller.

Here, the expression "to substantially stop exhaustion" includes not only a case in which the exhaustion of gas is completely stopped but also a case in which exhaustion of slight exhaust amount is permissible only if cleaning gas is substantially uniformly diffused in the reaction tube. Therefore, the flow of cleaning gas in the reaction tube is substantially stopped, the reaction tube can be filled with cleaning gas by diffusing the cleaning gas, the partial pressure of etching gas in the reaction tube becomes uniform, a pressure of the etching gas rises and thus, the etching speed (cleaning speed) is also increased.

The exhaustion from the gas exhausting tube may substantially be stopped simultaneously with or before the start of supply of the cleaning gas, and the exhaustion from the gas exhausting tube may substantially be stopped before several seconds are elapsed after the cleaning gas is supplied. When the exhaustion is stopped after the start of supply of cleaning gas from the gas introducing tube, in the timing of stop of the exhaustion, time required for closing the exhausting tube and time required for easily diffusing cleaning gas into the reaction tube substantially entirely are taken into consideration. For example, if time required for closing the exhausting tube is two seconds and time required for easily diffusing cleaning gas into the reaction tube substantially entirely is five seconds, the total is seven seconds, and it is preferable that the exhaustion is stopped within the seven seconds. A reason why a margin of five seconds is required is that since the exhaustion is stopped after a flow of gas is produced in the reaction tube, if a distance between a supply port of gas and an exhaust port is long and the path is complicated, it is possible to allow the cleaning gas to reach the reaction tube quickly.

A substrate processing apparatus according to a second preferred aspect of the present invention comprises:

a reaction tube;

a gas introducing tube which is in communication with the reaction tube;

a gas exhausting tube having a closing member, and a controller which controls an opening of said closing member to substantially stop exhaustion through the exhausting tube from a predetermined point of time before cleaning gas is supplied from the gas introducing tube into the reaction tube to a predetermined point of time after the cleaning gas is started to be supplied into the reaction tube such that there exists a state in which exhaustion from the gas exhausting tube is stopped while the cleaning gas is supplied from the gas introducing tube into the reaction tube to repeat a first stage fills the reaction tube with the cleaning gas under control of the controller and a second stage which thereafter exhausts gas from the reaction tube at least once.

In the second stage, since a reaction material after the cleaning reaction hinders subsequent cleaning reaction, it is possible to enhance the cleaning efficiency by once exhausting gas. The number of repetitions of the first and second stages depends on a film thickness and the like.

A substrate processing apparatus according to a third preferred aspect of the present invention comprises:

a reaction tube;

a gas introducing tube which is in communication with the reaction tube;

a cleaning gas supply member which supplies cleaning gas to the gas introducing tube, and a controller which controls an opening of the closing member to substantially stop exhaustion through the exhausting tube from a predetermined point of time before cleaning gas is supplied from the gas introducing tube into the reaction tube to a point of time when several seconds are elapsed after starting of supply of the cleaning gas into the reaction tube such that there exists a state in which exhaustion from the gas exhausting tube is stopped while the cleaning gas is supplied by the cleaning gas supply member through the gas introducing tube into the reaction tube.

Preferably, a semiconductor device is produced through steps including a substrate processing step which uses one of the above-mentioned substrate processing apparatus according to first to third preferred aspect of the present invention, and which substantially stops exhaustion through the exhausting tube from a predetermined point of time before the cleaning gas is supplied from the gas introducing tube into the reaction tube to a point of time when several seconds are elapsed after starting of supply of the cleaning gas into the reaction tube such that there exists a state in which exhaustion from the gas exhausting tube is stopped while the cleaning gas is supplied from the gas introducing tube into the reaction tube to fill the reaction tube with the cleaning gas under control of the controller.

Next, preferred embodiments of the present invention will be explained with reference to the drawings.

FIG. 1 shows a substrate processing apparatus 20 according to the embodiment of the invention. The substrate processing apparatus 20 is of a vertical type and has a casing 22 in which essential members are disposed. A pod stage 24 is connected to the casing 22, and the pod 26 is transferred to the pod stage 24. In the pod 26, 25 substrates are accommodated for example, and the pod 26 is closed with a lid (not shown) and in this state, the pod 26 is set on the pod stage 24.

A pod transfer device 28 is disposed in the casing 22 at a position opposed to the pod stage 24. Pod shelves 30, a pod opener 32 and a substrate-number detector 34 are disposed in the vicinity of the transfer device 28. The pod transfer device 28 transfers the pod 26 between the pod stage 24, the pod shelves 30 and the pod opener 32. The pod opener 32 opens the lid of the pod 26, and the substrate-number detector 34 detects the number of substrates in the opened pod 26.

A substrate carrying device 36, a notch aligner 38 and a substrate supporting body 40 (boat) are further disposed in the casing 22. The substrate carrying device 36 has an arm 42 capable of taking out five substrates for example, and the substrate carrying device 36 transfers the substrates between the pod 26 placed on the pod opener 32, the notch aligner 38 and the substrate supporting body 40 by moving the arm 42. The notch aligner 38 detects a notch and orientation flat formed in the substrates and aligns the substrates.

Figure 2:
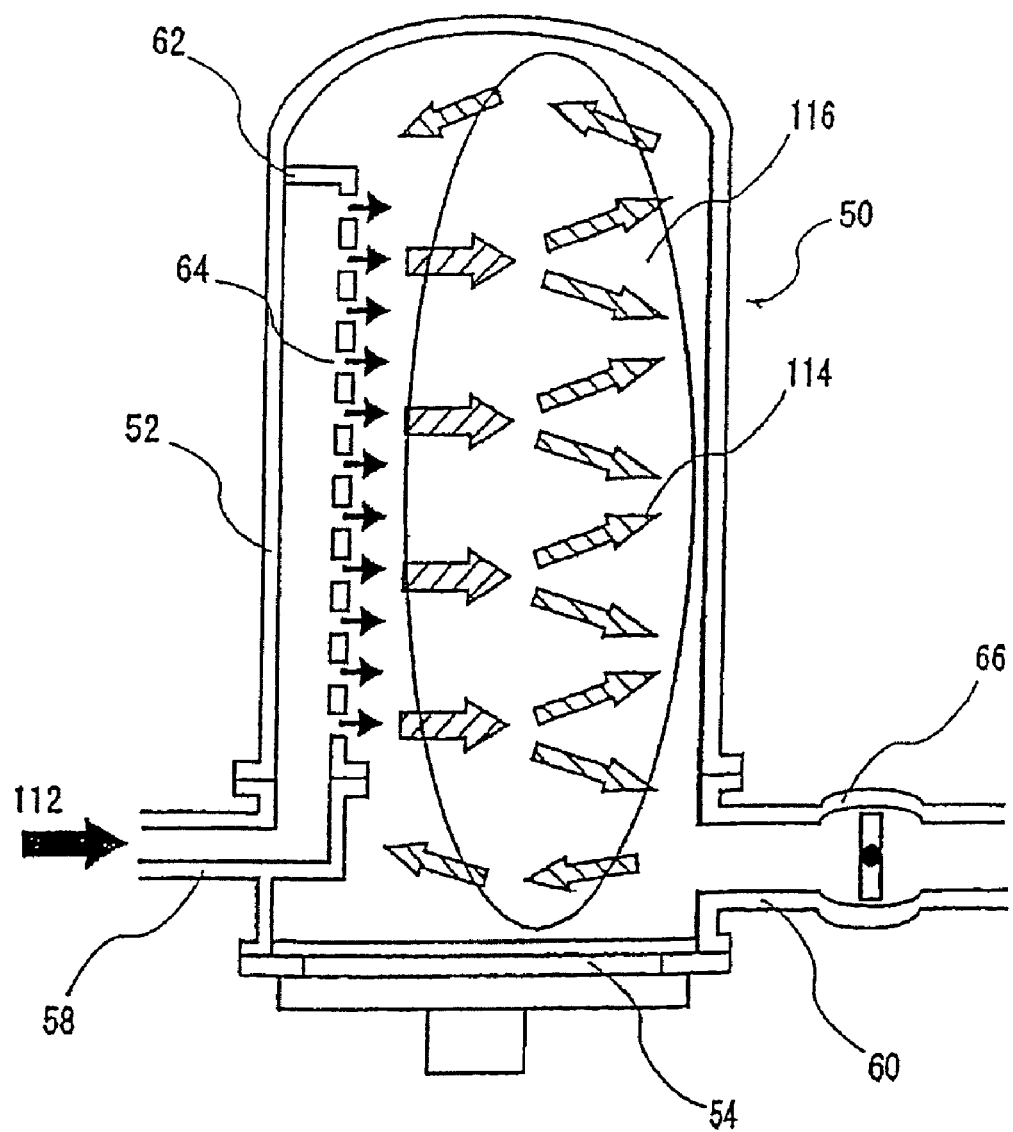
FIG. 2 is a sectional view showing a reaction furnace used in a substrate processing apparatus according to an embodiment of the present invention.

FIG. 2 shows a reaction furnace 50. The reaction furnace 50 includes a reaction tube 52. The substrate supporting body is inserted in the reaction tube 52. A lower portion of the reaction tube 52 is opened so that the substrate supporting body can be inserted therethrough, and this opened portion is tightly closed by a seal cap 54 (shown in FIG. 1 also). A heater 56 (shown in FIG. 3) is disposed around the reaction tube 52. A gas introducing tube 58 for supplying reaction gas and cleaning gas and a gas exhausting tube 60 for exhausting reaction gas and cleaning gas are connected to the reaction tube 52. Gas supplied from the gas introducing tube 58 is supplied into the reaction tube 52 from a large number of holes 64 of a gas nozzle 62 formed in the reaction tube 52. The gas exhausting tube 60 is provided with a closing member 66 comprising a pressure-adjusting valve for example, and the closing member 66 has a shut-off function.

Next, a substrate processing process by means of the substrate processing apparatus 20 having the above-described structure will be explained.

First, if the pod 26 holding a plurality of substrates therein is set on the pod stage 24, the pod 26 is transferred from the pod stage 24 to the pod shelf 30 and is stocked on the pod shelf 30. Next, the pod 26 stacked on the pod shelf 30 is transferred to the pod opener 32 by the pod transfer device 28, the lid of the pod 26 is opened by the pod opener 32, and the number of substrates accommodated in the pod 26 is detected by the substrate-number detector 34.

Next, the substrate carrying device 36 takes the substrates out from the pod 26 located at the position of the pod opener 32, and moves the pod 26 to the notch aligner 38. In the notch aligner 38, notches of the substrates are detected while rotating the substrates, and the plurality of substrates are aligned to the same position based on the detected information. Next, the substrate carrying device 36 takes the substrates out from the notch aligner 38 and moves them to the substrate supporting body 40.

If the one batch of substrates is moved to the substrate supporting body 40 in this manner, the substrate supporting body 40 in which the plurality of substrates are accommodated is loaded into the reaction furnace 50 whose temperature is set to a predetermined value, and the reaction tube 52 is tightly closed by the seal cap 54. Next, reaction gas is supplied into the reaction tube 52 from the gas introducing tube 58. Then, the substrates are processed in accordance with preset temperature rising and lowering program while monitoring a temperature in the reaction tube 52.

If the substrate processing is completed, the temperature is lowered to a predetermined value and then, the substrate supporting body 40 is unloaded from the reaction furnace 50, and the substrate supporting body 40 is brought into a standby state at a predetermined position until all of the substrates supported by the substrate supporting body 40 are cooled. Next, if the substrates of the standby substrate supporting body 40 are cooled to a predetermined temperature, the substrate carrying device 36 takes the substrates out from the substrate supporting body 40, and transfers the substrates to an empty pod 26 which is set to the pod opener 32. Next, the transfer device 28 transfers the pod 26 holding the substrates therein to the pod shelf 30 and further transfers the pod 26 to the pod stage 24 and the operation is completed.

Figure 3:
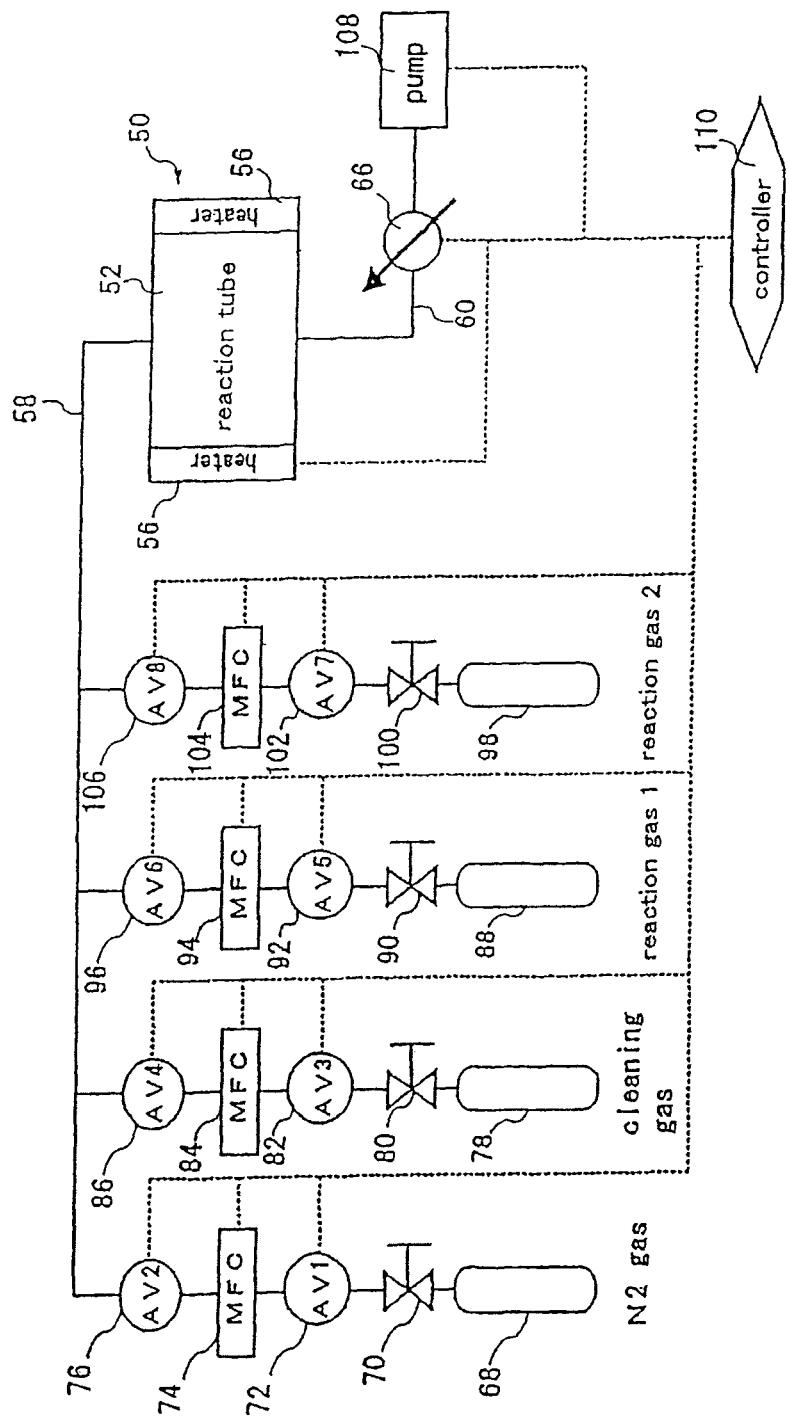
FIG. 3 is a gas system chart showing a gas system of a substrate processing apparatus according to an embodiment of the present invention.

FIG. 3 shows a gas system of the above-described substrate processing apparatus.

A first storage tank 68 storing N2 gas for purging is connected to the reaction tube 52 through a first manual valve 70, a first open/close valve 72, first flow-rate control valve 74, the second open/close valve 76 and the gas introducing tube 58. A second storage tank 78 storing cleaning gas is connected to the reaction tube 52 through a second manual valve 80, a third open/close valve 82, a second flow-rate control valve 84, a fourth open/close valve 86 and the gas introducing tube 58. A third storage tank 88 storing first reaction gas is connected to the reaction tube 52 through a third manual valve 90, a fifth open/close valve 92, a third flow-rate control valve 94, a sixth open/close valve 96 and the gas introducing tube 58. A third storage tank 98 storing second reaction gas is connected to the reaction tube 52 through a fourth manual valve 100, a seventh open/close valve 102, a fourth flow-rate control valve 104, an eighth open/close valve 106 and the gas introducing tube 58.

The gas exhausting tube 60 having the closing member 66 is connected to a dry pump 108. The reaction tube 52 is evacuated by the operation of the dry pump 108.

A controller (control section) 110 comprises a computer for example, and controls the opening and closing operations of the open/close valves 72, 76, 82, 86, 92, 96, 102 and 106, the flow rates of the flow-rate control valves 74, 84, 94 and 104, electric power to the heater 56, opening of the closing member 66, the actuation of the dry pump 108, and the like.

Next, the cleaning operation will be explained.

If the processing of several batches of substrates is repeated several times in the above-described manner, reaction by-product is deposited in a reaction space, e.g., on an inner wall of the reaction tube 52, the deposited by-product is peeled off with time, and this becomes particles, and there is a problem that the particles attached onto the substrate and deteriorate the yield.

Therefore, it is necessary to clean the reaction space periodically. In this embodiment, etching gas (e.g., $NF_3$ gas) is supplied as the cleaning gas, thereby carrying out self-cleaning in the reaction space. Although the cleaning operation is not shown in FIG. 2, the cleaning is carried out in a state in which the substrate supporting body is inserted into the reaction tube 52, and the by-product deposited on the substrate supporting body is also removed.

Figure 4:
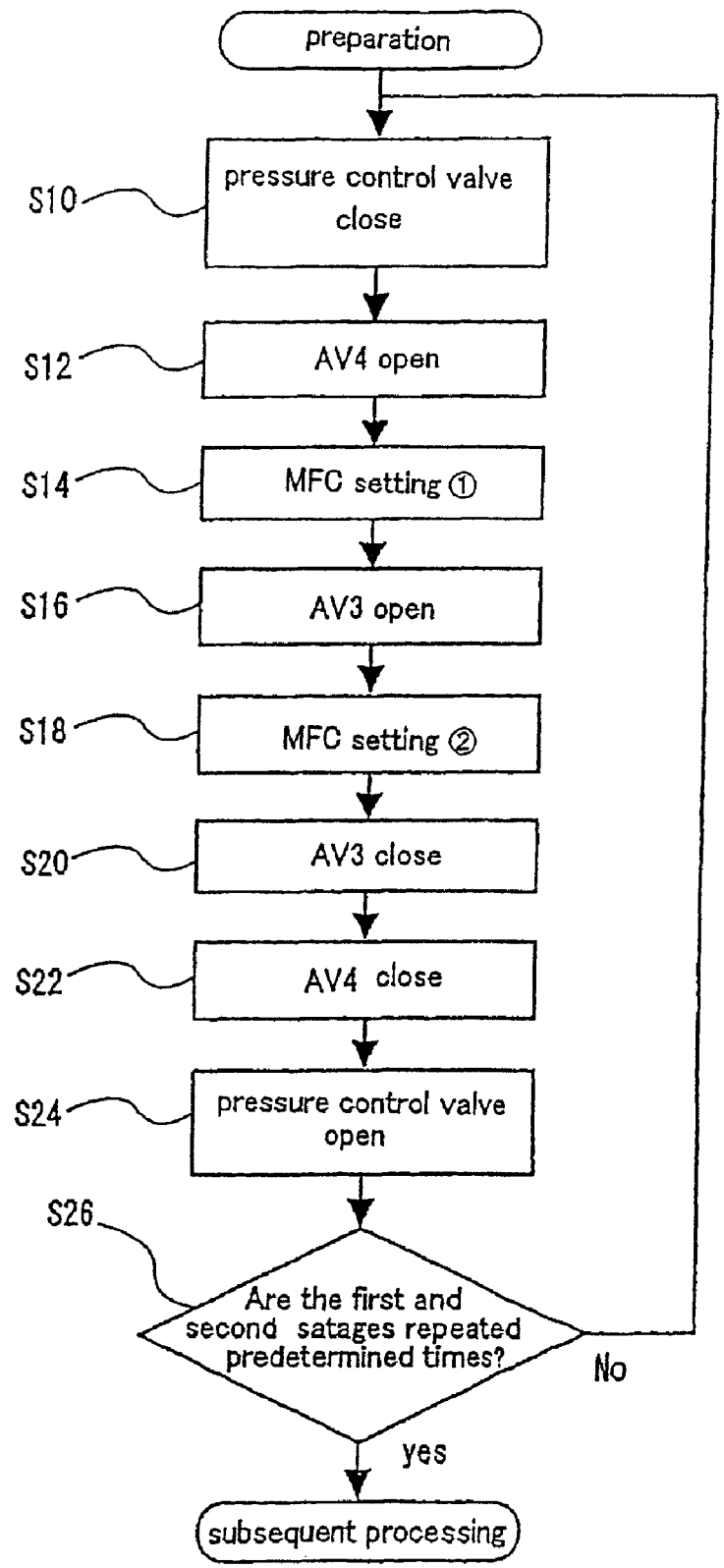
FIG. 4 is a flowchart showing a processing flow in cleaning steps of a substrate processing apparatus according to an embodiment of the present invention.
Figure 5:
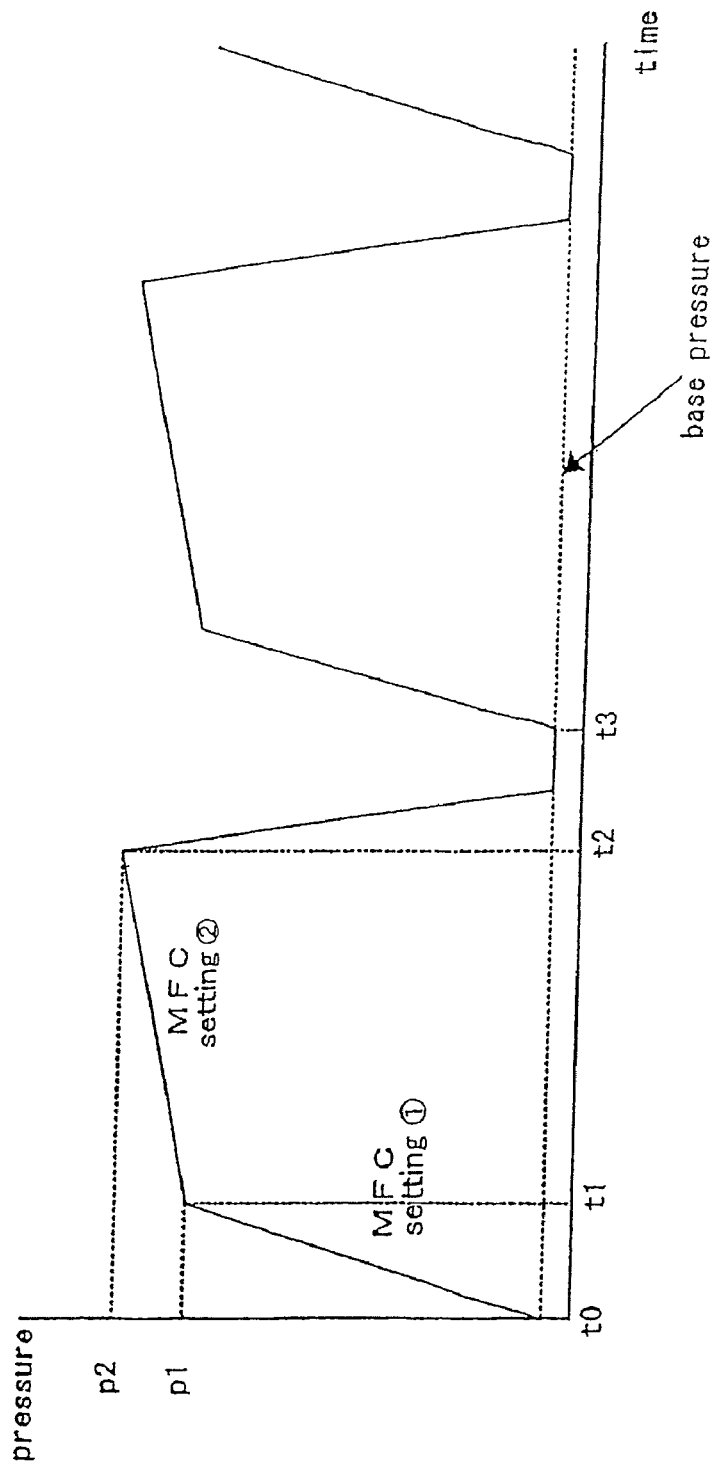
FIG. 5 is a time chart of cleaning steps of a substrate processing apparatus according to an embodiment of the present invention.

FIG. 4 is a flowchart showing an example of the control operation in cleaning steps of the controller 110. FIG. 5 shows a time chart in the control operation example.

First, in step S10, the closing member 66 is closed in a state in which a pressure in the reaction tube 52 is set to a base pressure. In step S12, the fourth open/close valve 86 is opened. In step S14, a flow rate of the second flow-rate control valve 84 is set to a first set value. This first set value is 1.5 slm for example. In step S16, the third open/close valve 82 is opened and the supply of etching gas is started (t0 in FIG. 5). With this, a pressure in the reaction tube 52 gradually rises. This state is maintained for time t1, and the pressure in the reaction tube 52 when the time t1 is elapsed reaches p1. The time t1 is 25 seconds for example, and the p1 is 10 Torr for example. If the time t1 is elapsed, in next step S18, the flow rate of the second flow-rate control valve 84 is set to a second set value. The second set value is 0.25 slm for example. With this, the pressure in the reaction tube 52 is increased from p1 to p2 or maintained at p1. In this embodiment, the p2 is 10 Torr and is equal to the p1. This state is maintained for time t2. The time t2 is 65 seconds for example.

If the flow rate of the second flow-rate control valve 84 is reduced from the first set value (e.g., 1.5 slm) to the second set value (e.g., 0.25 slm), the following effects can be obtained.

(a) By supplying the etching gas with the first set value which is higher than the second set value, the pressure can be quickly increased to such a value that effective etching speed can be obtained.

(b) By supplying the etching gas with the second set value which is lower than the first set value, concentration of the etching gas in the vicinity of the holes 64 of the gas nozzle 62 can be reduced, and the uniformity of the etching gas in the reaction tube can be enhanced.

(c) By supplying the etching gas with the second set value which is lower than the first set value, it is possible to add etching gas to supplement the etching gas consumed by the etching, and to prevent a partial pressure of the etching gas caused by the etching from being lowered. In a state in which a pressure in the reaction tube becomes p2, this state may be maintained for time t4. The time t4 is 45 seconds for example.

The procedure up to here is a first stage. The etching gas is allowed to flow into the reaction tube 52 from the large number of holes 64 through the gas nozzle 62 extending from the gas introducing tube 58 in the longitudinal direction of the reaction tube 52. In this state, if the closing member 66 of the gas exhausting tube 60 is closed, the gas fills in the reaction tube 52 and is contained therein.

With this, a deviated flow of etching gas 112 toward the gas exhausting tube 60 is moderated, the etching gas is diffused in the reaction tube 52 entirely, and the partial pressure of the etching gas 112 in the reaction tube 52 becomes uniform.

In FIG. 2, a reference number 114 shows a diffusing state of the etching gas 112 after it is supplied into the reaction tube 52. A reference number 116 shows a phantom region where the etching gas 112 is entirely diffused in the reaction tube 52 uniformly.

Concerning the variation in partial pressure of the etching gas in upstream and downstream of the gas by consumption of the etching gas 112 and product gas by the etching, the partial pressure of the etching gas becomes uniform by the etching gas and the diffusion of the product gas by the etching gas.

That is, removal of the reaction by-product deposited on the inner wall of the reaction tube 52 can be expressed by the following principle. $Si_3N_4$ which is the reaction by-product (solid state) and $4NF_3$ which is the etching gas are reacted with each other and product gas of the $Si_3N_4$ and $4NF_3$ is produced, thereby removing the reaction by-product.

A temperature in the reaction tube 52 during this is maintained at 630° C.

When there exists a gas flow in the reaction tube as in the conventional technique, in an upstream portion of the gas flow, NF3 is consumed but the $Si_3N_4$ and $4NF_3$ exist excessively, and the partial pressures of the etching gas are different in the upstream portion and downstream portion of the gas flow.

If the gas flow is not formed and the gas is contained as in the embodiment of the present invention, however, since the $NF_3$, $SiF_4$ and $N_2$ are prone to be diffused, the partial pressures thereof become equal, and uniform etching gas can be supplied into the reaction tube 52. With this, uniform cleaning can be carried out.

Since gas is not exhausted during the supply of etching gas in the first stage, although the pressure in the reaction tube 52 rises, the etching speed is also increased by this pressure rise.

If time t2 is elapsed after the second flow-rate control valve 84 is set to the second set value in step S18 as described above, the procedure is proceeded to step S20. The third open/close valve 82 is closed in step S20, the fourth open/close valve 86 is closed in step S22, and the closing member 66 is opened in step S24. With this, the etching gas in the reaction tube 52 is exhausted through the gas exhausting tube 60, and a pressure in the reaction tube 52 is abruptly reduced to the base pressure.

The procedure up to here is a second stage. The etching gas and the product gas are exhausted.

In step S26, it is judged whether the processes of the first and second stages are repeated predetermined times. If it is judged in step S26 that the processes are repeated the predetermined times, the procedure is proceeded to a next process (substrate processing). On the other hand, if it is judged in step S26 that the processes are not repeated the predetermined times, the procedure is returned to step S10, and the processes of the first and second stages are executed repeatedly. In step S22, time t3 is elapsed after the closing member 66 is opened, and the etching gas and the product gas in the reaction tube 52 are sufficiently exhausted, and the closing member 66 is closed in the next cycle. This time t3 is four seconds for example.

As described above, uniform cleaning can be carried out by dividing the cleaning step in the reaction tube 52 into the first stage and the second stage and carrying out the stages, but if it is desired to further enhance the cleaning efficiency, more uniform etching with no remainder of etching can be carried out by repeating the first and second stages at least two times or more.

According to the cleaning method provided by the embodiment of this invention, the uniform cleaning in the reaction tube can be carried out.

If a substrate processing apparatus in which the interior of the reaction tube is self-cleaned in the cleaning step is used, it is possible to produce a high quality semiconductor device.

The present invention is not limited to the above-described embodiment, and various modifications can be made.

That is, it is unnecessary to completely stop the exhaust of gas in the first stage, and the etching gas may be supplied while exhausting the etching gas only if the exhausting amount is set to such a degree that the flow of etching gas supplied into the reaction tube does not become nonuniform and the uniform diffusion of gas is not affected.

If the first stage is again carried out when the second stage is carried out or after the second stage is carried out, etching gas may slightly be supplied instead of completely stopping the supply of the etching gas. If the first stage is not carried out again after the second stage, it is preferable that the supply of the etching gas is completely stopped and the gas is exhausted because the gas (etching gas) is not remained for the next processing.

As described, only if the cleaning gas is uniformly diffused in the reaction tube at the time of the first stage, this method can variously be modified.

Figure 6:
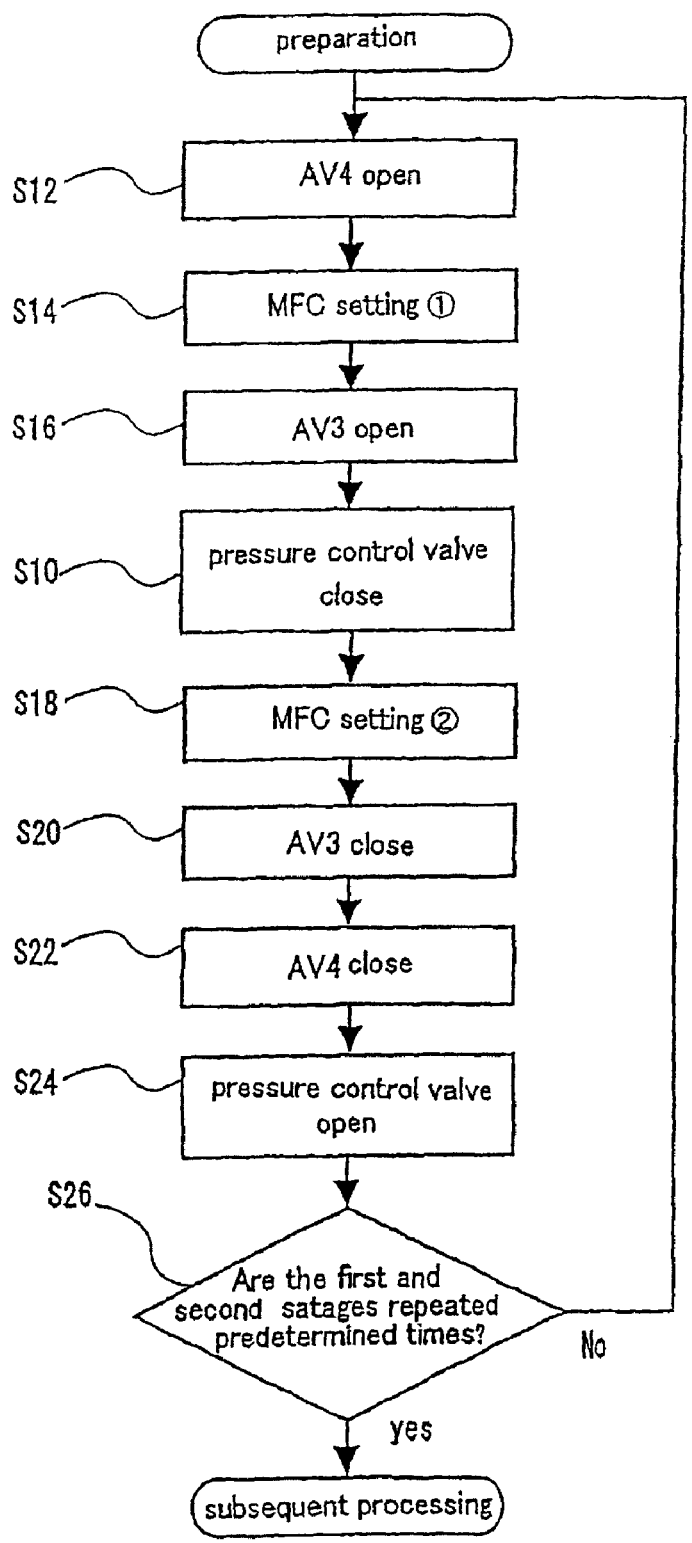
FIG. 6 is a flowchart showing a processing flow in cleaning steps of a substrate processing apparatus according to another embodiment of the present invention.
Figure 7:
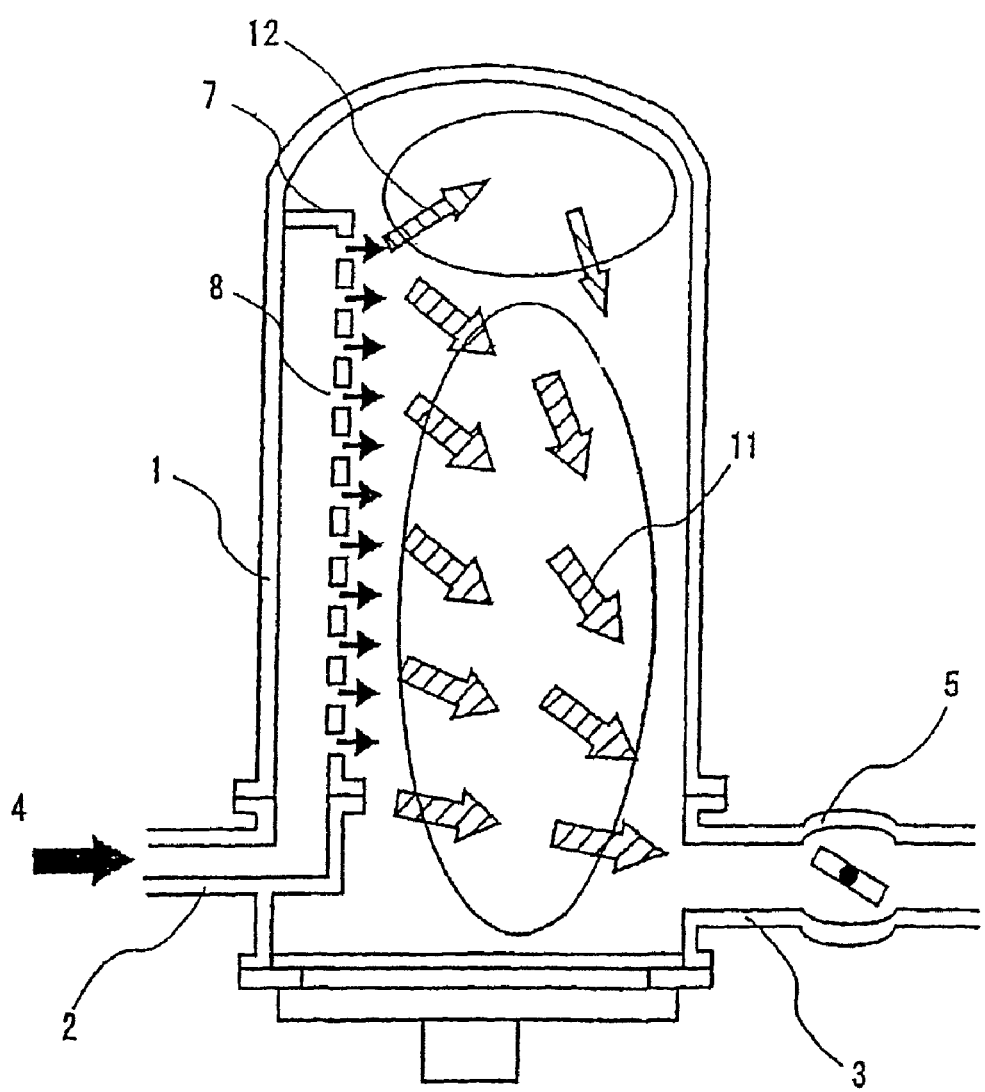
FIG. 7 is a sectional view showing a conventional reaction furnace.

FIG. 6 shows another embodiment. This other embodiment is different from the previous embodiment in the following point. That is, the closing member is closed and exhausting operation of gas is stopped before the start of supply of cleaning gas in the previous embodiment, but the closing member is closed and exhausting operation of gas is stopped after the start of supply of cleaning gas in this other embodiment.

That is, in this embodiment, steps S12, S14 and S16 are first executed, and cleaning gas is supplied to the reaction tube. Then, after predetermined time is elapsed, step S10 is executed and the exhausting operation is stopped. In this predetermined time, time required for closing the closing member and time required for easily diffusing cleaning gas into the reaction tube substantially entirely are taken into consideration. For example, if time required for closing the closing member is two seconds and time required for easily diffusing cleaning gas into the reaction tube substantially entirely are taken into consideration is five second, the total is seven seconds, and it is preferable that the exhausting operation is stopped within the seven seconds. A reason why a margin of five seconds is required is that since the exhausting operation is stopped after a flow of gas is produced in the reaction tube, if a distance between a supply port (e.g., outlet of the fourth open/close valve 86) of gas and an exhaust port (inlet of the gas exhausting tube 60) is long and the path is complicated, it is possible to allow the cleaning gas to reach the reaction tube quickly.

In the explanation of the above embodiments, the substrate processing apparatus is described as a batch type apparatus which processes a plurality of substrates, but the substrate processing apparatus is not limited to this, and a single substrate-feeding type apparatus may also be employed.

The entire disclosures of Japanese Patent Application No. 2002-92733 filed on Mar. 28, 2002 and Japanese Patent Application No. 2002-366250 filed on Dec. 18, 2002 including specifications, claims, drawings and abstracts are incorporated herein by reference in their entireties.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus, comprising:
    a reaction tube capable of accommodating a plurality of substrates;
    a gas nozzle that introduces a reaction gas supplied through a first flow-rate control valve and a cleaning gas supplied through a second flow-rate control valve into the reaction tube, the gas nozzle extending in a longitudinal direction of the reaction tube and having a large number of holes;
    a gas exhausting tube that exhausts an atmosphere in the reaction tube, the gas exhausting tube being connected to a lower portion of the reaction tube and having a closing member;
    a controller that controls the first and second flow-rate control valves and the closing member such that
    in a state wherein the substrates are accommodated in the reaction tube, the reaction gas is supplied from the holes into the reaction tube to process the substrates,
    thereafter in a state wherein the substrates are transferred out from the reaction tube, a first stage and a second stage are repeated at least two cycles to remove reaction by-product deposited in the reaction tube, the first stage being a stage wherein a cleaning gas is supplied until a pressure in the reaction tube becomes 10 Torr or more after the cleaning gas is started to be supplied into the reaction tube, with exhaustion from the reaction tube being completely stopped or the reaction tube being exhausted at an exhausting rate that does not affect a uniform diffusion of the cleaning gas in the reaction tube from a predetermined point of time before the cleaning gas is supplied into the reaction tube to a point of time before the cleaning gas is supplied into the reaction tube to a point of time when several seconds are elapsed after starting of the supply of the cleaning gas into the reaction tube, and the second stage being a stage wherein immediately after the first stage the supply of the cleaning gas is completely stopped, an inside of the reaction tube is exhausted to a base pressure.

2. A substrate processing apparatus as recited in claim 1, further comprising a heater, wherein
    the controller controls the heater such that the inside of the reaction tube is heated at 630° C. when the cleaning gas is supplied, and
    the cleaning gas is $NH_3$ and the reaction by-product is $Si_3N_4$.

* * * * *